United States Patent [19] [11] 3,736,528
Acker et al. [45] May 29, 1973

[54] VOLTAGE CONTROLLED OSCILLATOR

[75] Inventors: William F. Acker, Seminole; Gordon F. Bremer, St. Petersburg, both of Fla.

[73] Assignee: Honeywell Information Systems Inc., Waltham, Mass.

[22] Filed: Nov. 24, 1971

[21] Appl. No.: 201,674

[52] U.S. Cl. ................331/143, 328/127, 331/108 D
[51] Int. Cl. ................H03k 3/15
[58] Field of Search ................331/111, 143, 145, 331/108; 328/127

[56] References Cited

UNITED STATES PATENTS

| | | | |
|---|---|---|---|
| 3,047,820 | 7/1962 | Lawton | 331/143 |
| 3,138,767 | 6/1964 | Levin | 328/127 |
| 3,256,426 | 6/1966 | Roth et al. | 328/127 |
| 3,274,501 | 9/1966 | Heinsen | 328/127 |
| 3,302,132 | 1/1967 | Karklys | 331/145 |
| 3,360,744 | 12/1967 | Blitz et al. | 331/111 |
| 3,422,372 | 1/1969 | Post et al. | 331/178 |
| 3,588,713 | 6/1971 | Yareck | 328/127 |
| 3,610,952 | 10/1971 | Chandos | 328/127 |

OTHER PUBLICATIONS

Electronic Design, pg. 38, June 7, 1965.
EEE, J. F. Kingsbury, pg. 109–110, Oct. 1969.

*Primary Examiner*—John Kominski
*Attorney*—Nicholas Prasinos, Ronald T. Reiling and Fred Jacob

[57] ABSTRACT

A voltage controlled oscillator having a wide tuning range and being stable in frequency and phase as a function of temperature and/or time. The threshold voltage of a comparator is periodically varied abruptly to produce oscillations. The frequency of oscillations is electrically varied by varying the period between the threshold voltage changes.

9 Claims, 1 Drawing Figure

Patented May 29, 1973 3,736,528
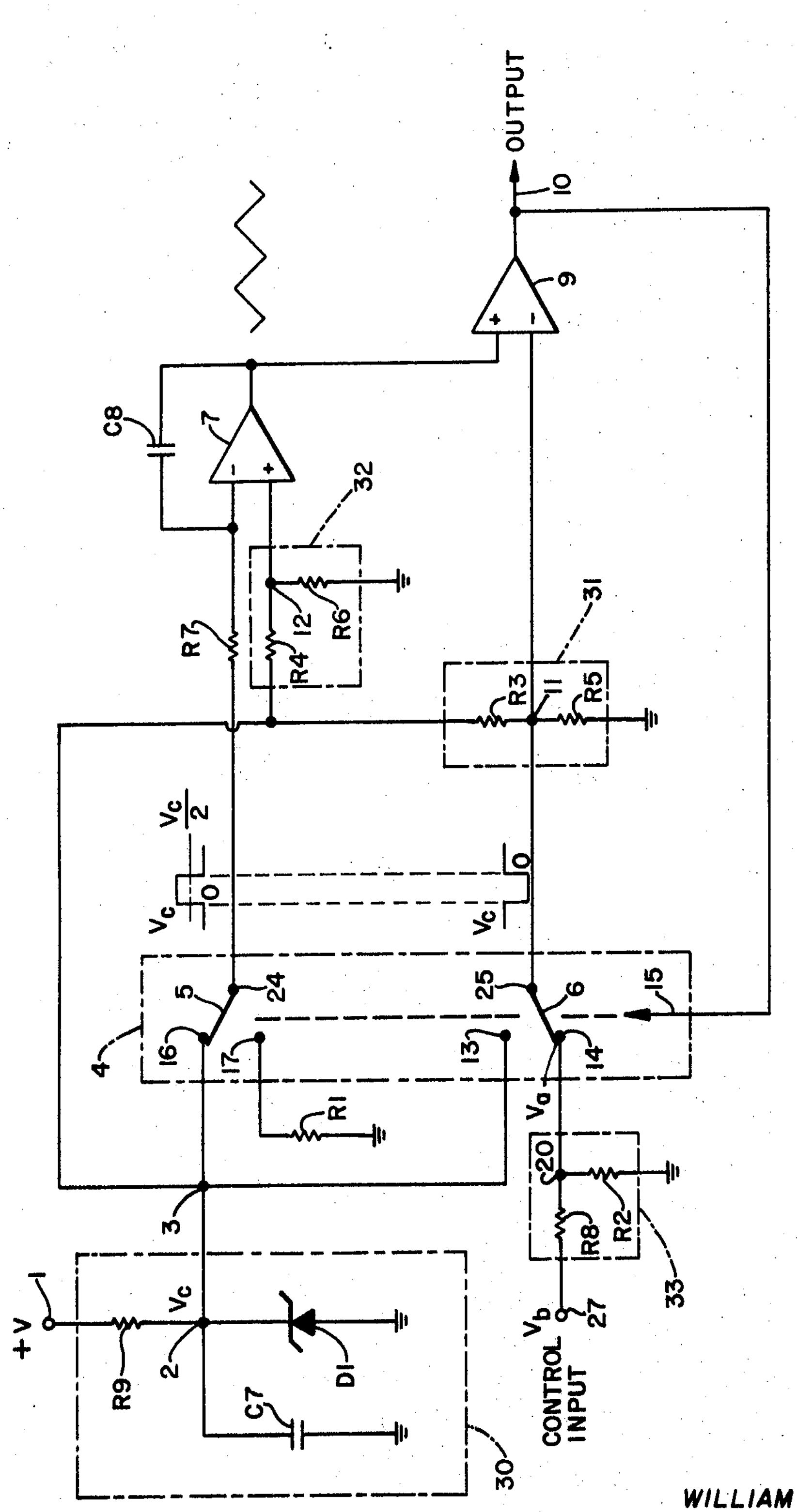
INVENTORS
WILLIAM F. ACKER
GORDON F. BREMER
BY
Nicholas Psarinos
ATTORNEY

VOLTAGE CONTROLLED OSCILLATOR

BACKGROUND OF THE INVENTION

1. Field of the Invention

This invention relates generally to voltage controlled oscillators and more particularly to voltage controlled oscillators having a large tuning range and good frequency and phase stability.

2. Description of the Prior Art

There are many existing oscillator circuits known in the art, and a good number of these oscillator circuits are voltage controlled. Voltage controlled oscillators may be utilized in present day telemetering systems as well as other systems employing frequency or phase control.

There are numerous requirements placed on voltage controlled oscillators (VCO's) depending on the application. Chief among these requirements are the following:

a. large electrical tuning range;

b. frequency stability;

c. phase stability;

d. capability for accepting wideband frequency and phase modulation; and e. linearity of frequency versus control voltage.

Some of these requirements, however, are in direct opposition to the other requirements e.g., frequency and phase stability is opposed to large tuning range, linearity of frequency versus control voltage and capability for accepting wideband modulation. Therefore, to obtain larger tuning range usually some sacrifice was made in frequency stability. Yet in some applications; such as for example, in many phase-lock-loops it is desirable to have a VCO with good frequency stability as well as large tuning range.

In phaselock loops one ideal requirement is that the loop track the frequency and phase of the input signal with no error. However, if the input signal is jittering this condition requires that the loop bandwidth be infinite, yet for practical requirements loop-bandwidth has finite limits. Moreover as loop-bandwidth is made narrower, loop phase jitter with respect to the input increases, and if bandwidth is made too narrow, phase jitter becomes so great that the loop does not lock. Therefore large bandwidth is required to maintain lock, if the input signal jitters over a large bandwidth.

Prior art VCO's in common use comprise:

a. Crystal oscillators;

b. LC Oscillators; and, c. RC Multivibrators.

Crystal oscillators are the most stable but have a very narrow tuning range, generally no greater than ±0.1 percent of nominal oscillator frequency. LC oscillators such as the well known Hartley and Colpitts oscillators have a wider range of up to ±30 percent but suffer somewhat in frequency stability. Finally, relaxation oscillators such as multivibrators and blocking oscillators have an even larger tuning range but frequency stability assumes little importance.

What is required for certain VCO's, particularly those that are slated to be utilized in phaselock loops, is a high degree of frequency stability with temperature and also a large tuning range. A further requirement is that these favorable characteristics be achieved without resorting to complicated circuits and/or expensive precision components.

The instant invention meets these requirements.

SUMMARY OF THE INVENTION

Briefly, the invention herein disclosed comprises a VCO having a tuning range greater than 100 percent of the nominal oscillator frequency, yet with little sacrifice in frequency stability with temperature and time, and moreover the VCO is TTL (transistor-transistor-logic) compatible.

Essentially a square wave is generated and used to drive an integrator to produce a ramp voltage at the output of the integrator. The ramp voltage is then applied to the positive input of a comparator, an inverted replica of the square wave is applied to the negative input of the comparator to set its threshold voltage to some adjustable level $V_a$ or to voltage $V_c$ depending on the state of the comparator output voltage. When the ramp voltage exceeds the threshold voltage in either direction (plus or minus depending on the prior state of the comparator which indirectly controls its own threshold voltage and the direction of slope of the ramp voltage) then the comparator changes state and the threshold voltage jumps abruptly to its alternate state and the direction of the voltage ramp reverses. The circuit elements are arranged so that the ramp voltage is always moving toward the threshold voltage and each time the ramp voltage reaches the threshold voltage the comparator switches the threshold voltage to its alternate state. Thus the comparator output voltage switches up and down in a steady sustained oscillation.

To control the frequency of the VCO, a control voltage is applied to change the adjustable threshold voltage $V_a$ so that a longer or shorter time interval is required for the ramp voltage to traverse back and forth between the fixed upper threshold $V_c$ and the adjustable lower threshold $V_a$.

The frequency of the VCO is therefore controlled by controlling the period, T, required for the ramp voltage of the integrator output to traverse from voltage $V_c$ and back again.

OBJECTS

It is an object therefore of the instant invention to produce an improved VCO.

It is another object of the invention to produce a VCO having a wide tuning range with good frequency stability.

It is still another object of the invention to provide a VCO comprised of relatively simple circuits lending themselves to relatively low cost manufacture.

It is a further object of the invention to provide a VCO that particularly lends itself for use in phase-lock-loops.

These and other objects of the invention will become manifest from reading the following detailed description in connection with the drawings contained herewith.

BRIEF DESCRIPTION OF THE DRAWINGS

FIG. 1 is a circuit diagram of one embodiment of the invention.

DESCRIPTION OF A PREFERRED EMBODIMENT

Referring now to FIG. 1, a constant, relatively noise free voltage, which may typically be 6 volts, is developed at points 2 and 3 by the circuit 30 enclosed in dash-dot lines. Inspecting circuit 30 more closely, a plus voltage +V is applied to input terminal 1 which is coupled to junction point 2 through resistor R9. Junction point 2 is moreover coupled to ground via two parallel paths, one path being through capacitor C7 and the other path being through Zener diode D1. The voltage at junction point 2 is applied to junction point 3 where it may be used by the remainder of the circuit for various purposes. In the first instance, the voltage at point 3 is utilized to develop a virtual ground (+3 Volts DC) at point 12 by dividing the voltage at point 3 in half utilizing a voltage divider 32. Voltage divider 31 would keep point 11 at virtual ground in a similar manner except that point 11 is normally driven to Voltage $V_a$ or $V_c$ through switch 6. Inspecting voltage dividers 31 and 32 in greater detail, it is seen that voltage divider 31 comprises resistors R3 and R5 coupled to each other at junction point 11 with resistor R3 also being coupled to junction point 3 and junction point 23 and resistor R5 additionally being coupled to ground. Voltage divider 32 comprises resistor R4 coupled to resistor R6 at junction point 12; resistor R4 being further coupled to junction point 23 which in turn is coupled to junction point 3; and resistor R6 is additionally coupled to ground. Junction point 12 of resistors R4 and R6 is coupled to the positive non-inverting terminal of the operational amplifier 7, which is used as part of an integrator circuit.

The voltage at point 3 is further applied to switching unit generally denoted by the numeral 4 and enclosed by dash-dot lines. This switching unit 4 is further comprised of at least two switches 5 and 6. (Although in the Figure switches 5 and 6 are shown as mechanical switches controlled by the output voltage 10 of comparator 9, they are typically electronic switches such as for example the NH0014 type MOSFET switches manufactured by National Semiconductor Corporation). Terminal 16 of switch 5 is coupled to junction point 3, terminal 17 of switch 5 is coupled to ground through resistor R1 and terminal 24 of switch 5 is coupled to the minus inverting terminal of integrator operational amplifier 7 through resistor R7. Terminal 13 of switch 6 is coupled to junction point 3 and thereby maintained at voltage $V_c$; terminal 14 of switch 6 is coupled to junction point 20 which in turn is coupled to ground through resistor R2 and is also coupled to control voltage, $V_b$ at input terminal 27 through resistor R8. Terminal 25 of switch 6 is coupled to the inverting input terminal (marked by a minus sign) of comparator 9 through junction point 11. A capacitor C8 is coupled to the input and output of the integrating operational amplifier 7. The output of the integrating operational amplifier 7 is coupled to the non-inverting input terminal (marked with a plus sign) of comparator 9, whereas the output terminal 10 of comparator 9 is further coupled to control 15 of switching unit 4 which controls the switching of switches 5 and 6.

Below are Tables I and II. Table I sets forth the values of typical components that may be used in the circuit of FIG. 1 although other values of components may also be used in proper relationship one to the other. Table II sets forth some typical types and manufacturers for components which may also be utilized in the circuit of FIG. 1.

TABLE I MAGNITUDE OF COMPONENTS

| Component Identification | Magnitude | Units |
|---|---|---|
| R1 = R2 | | Ohms |
| R3 = R4 = R5 = R6 | 40,000 | Ohms |
| R7 | 20,000 | Ohms |
| R8 | 5,000 | Ohms |
| R9 | 1,000 | Ohms |
| C7 | 1.0 | Microfarad |
| C8 | 0.001 | Microfarad |

TABLE II TYPE OF COMPONENTS

| Component Identification | Type | Manufacturer |
|---|---|---|
| 5, 6 | NH0014 MOSFET Switches | National Semiconductor Corporation |
| 7 | LM307 | National Semiconductor Corporation |
| 9 | LM311 | National Semiconductor Corporation |
| D1 | IN753A | Motorola |

In operation the constant, relatively noise free voltage $V_c$ is developed by voltage regulator 30 and applied to junction point 3. The voltage at junction point 3 is divided in half by voltage divider 32 and by voltage divider 31 when switch 6 is open and applied to junction points 12 and 11 respectively. Moreover the constant voltage $V_c$ at junction point 3 is applied to terminals 16 and 13 of switches 5 and 6 respectively. As switch 5 is switched between ground and $V_c$ and switch 6 is switched between $V_c$ and $V_a$ (the voltage at junction point 20) the output voltage from switches 5 and 6 at terminals 24 and 25 respectively are square waves having a dc voltage component and are 180° out of phase one with the other. The square wave generated at switch terminal 24 is applied to the minus (inverting) input terminal of integrator operational amplifier 7 through resistor R7 and produces at the output of the integrating amplifier 7 a triangular wave. The slope of the ramp voltage of the triangular wave will be positive or negative depending on the polarity of the square wave input signal applied to the negative input terminal of the integrating amplifier 7 as compared to the polarity of the voltage applied to the positive input terminal 12, which is explained above. (A positive slope is herein defined as an increasing value with respect to time and a negative slope is herein defined as a decreasing voltage value with respect to time.) Therefore if the voltage signal applied to the negative input terminal of integrator 7 is positive with respect to the voltage applied to the positive input terminal of integrator 7 the slope of the output ramp voltage will be negative and vice-versa.

Consider now a first point in time i.e., when junction point 11 is at ground (the control voltage is assumed to be zero) and assume that the triangular wave at the output of amplifier 7 is positive at this same instant. Since the output of amplifier 7 is positive as compared to the non-inverting input terminal of the comparator, the output of comparator 9 will also be positive, because the output of amplifier 7 is applied to the positive non-inverting terminal of comparator 9. Moreover at this same instant the positive output from the comparator 9 holds switches 5 and 6 in such a position so that the output 25 of switch 6 is coupled to ground through resistor R2 and the output 24 of switch 5 is coupled to the regulated plus DC voltage $V_c$. Resistors R3, R5, and R8 are very large compared with R2 and the effect of the control input voltage $V_b$ at point 27 is assumed to be negligible; therefore in this state, junction point 11 is essentially at ground potential. Switch 5 applies the positive voltage $V_c$ to R7 the input resistor to the minus input terminal of integrating amplifier 7 while the positive input terminal 12 of this amplifier is at the lower "virtual ground" potential $V_a/2$ hence the amplifier output voltage has a negative slope. Therefore the output voltage of integrator 7 is tending toward ground potential which is the threshold level at junction point 11. when this ramp voltage passes through the threshold voltage (nominally zero at this time) at junction point 11, comparator 9 will change state, because the voltage applied at the positive terminal of comparator 9 will become negative with respect to the voltage applied to the negative terminal of comparator 9. When comparator 9 changes state its output voltage 10 will go from its previous high state (+5 volts) to its low state (zero volts) which is applied to the control 15 of switch element 4 thus causing switches 5 and 6 to also change state simultaneously.

Now consider a second point in time which occurs immediately after the change of state of switch element 4 discussed above wherein switch terminal 24 of switch 5 is now coupled to ground through resistor R1, and switch terminal 25 of switch 6 is now coupled to the plus DC voltage $V_c$ at point 2. Hence junction point 11 which was previously at ground potential substantially instantaneously changes state from ground potential up to the positive potential $V_c$; this action causes the threshold voltage level of comparator 9 to be set to a new level. Since the negative input resistor R7 to integrating amplifier 7 was simultaneously switched to ground, the voltage applied to the negative input resistor of integrating amplifier 7 is now negative as compared to the voltage at junction point 12 which is applied to the positive input terminal of amplifier 7; therefore the output triangular wave voltage of integrator 7 which previously had a negative slope now obtains a positive slope and the output voltage starts back up again. When this positive going ramp voltage passes through the voltage level of the new threshold voltage at junction point 11 the comparator output 10 switches from its low state back to its high state and the cycle is complete. The switching of the comparator output from one level to another and back represents one cycle of the desired square wave oscillator output.

Neglecting hardware imperfections and the frequency control voltage $V_b$, the nominal frequency of the VCO is solely determined by the values of R7 and C8 or the RC constant of the integrator 7. This time constant determines the rate of rise or fall of the ramp voltage. For stability of an RC VCO it is usually necessary that the rate of rise or fall of the ramp voltage does not change with respect to temperature or time. However, the rate of rise or fall of the triangular wave voltage could be affected by changes in the reference voltage $V_c$, or the impedances of the switch circuits 4, which in turn could vary with temperature and time because of the variations experienced in semi-conductor elements such as the MOSFET switches 5 and 6 and the Zener diode D1. However, it will be noted from the Figure that any variation up or down of the Zener diode controlled reference voltage $V_c$ will vary the threshold voltage of the comparator 9 by the same amount that it varies the slope of the output triangular wave voltage from integrator 7. Hence variations in the Zener voltage will not change the period of the oscillation. If the resistances of MOSFET switch 5 are equal to those of MOSFET switch 6 the comparator threshold voltages and the slopes of the triangle wave voltages will change equally.

Hence variations in temperature which cause variations of the component characteristics have very little effect on the frequency of the VCO.

To construct a relatively simple and relatively low cost VCO it is desirable to use parts commercially available such as for example to use an LM311 comparator for comparator 9 and to use an LM307 amplifier for integrating amplifier 7; both of these devices are available commercially from National Semiconductor Corporation. However these devices would have some bias current, offset current, and offset voltage. (For a discussion of operational amplifiers including offset see "Fairchild Semiconductor Linear Integrated Circuit Application Handbook" by James N. Giles, published in 1967.) Any offset of the operational amplifier would tend to alter the ramp voltage somewhat since it would provide a DC component at the output. Therefore its effects must be compensated. Consider for example that any bias current required at junction point 12 is going to create a load which draws the current through resistors R4 and R6 which in general would change the voltage at the junction point 12. Moreover any current required by the negative input of operational amplifier 7 would do the same thing i.e., would tend to draw DC current through resistor R7 which in turn would tend to alter the ramp voltage somewhat. To compensate for this effect a parallel combination is made of resistor R4 and R6 which is equal to the value of resistor R7. This therefore would tend to equalize the effects of any bias currents that would tend to flow and because these currents would be in the same direction at the input, the resulting voltages applied the inverting and non-inverting amplifier input terminals would tend to be equal and to cancel each other out in their effects on the output. Moreover besides eliminating the effect of offset currents, these resistors R4 and R6 also act as voltage dividers to create the $V_c/2$ voltage applied at junction point 12, as has herein before described.

The effects of offset voltages and offset currents in amplifier 7 and comparator 9 are largely or entirely cancelled out by the fact that the effects work oppositely during upward and downward slopes of the triangle wave.

Having substantially achieved the stability requirements of the VCO let us consider how the frequency is controlled/or varied by use of a control voltage $V_b$.

In review, up to this point it has been shown how the output of integrator 7 is a triangular wave voltage whose frequency may be preselected by proper selection of the RC constant. This waveform is generated by applying a square wave or rectangular voltage to the minus input resistor of integrating amplifier 7. It has moreover been shown that the threshold voltage of the comparator 9 may be set at junction point 11 by either grounding junction point 11 or connecting it to a positive voltage supply terminal which provides the DC voltage $V_c$. To control the frequency of the VCO all that remains to be done is to vary the time interval of period T, the period between changes in state of comparator 9. To vary the time interval between state changes of comparator 9, the magnitude of the comparator threshold voltage may be varied either up or down which in turn would cause the output ramp voltage of integrating amplifier 7 to intersect the threshold either sooner or later in time, because the separation between the two voltages in magnitude would be greater or less depending on the control voltage $V_b$. Referring once again to FIG. 1, it is seen that the control voltage $V_b$ is applied to control input terminal 27 and this voltage is divided through voltage divider 33. Voltage divider 33 comprises as hereinbefore described a resistor R8 and resistor R2 coupled to each other at junction point 20 and wherein resistor R8 is also coupled to a control input terminal 27 and resistor R2 is coupled to ground. Consequently junction point 20 provides a small change in voltage which is a linear function of the control voltage. Assuming therefore for illustrative purposes that switch 6 is closed such that junction point 11 is coupled to junction point 20. By varying the control voltage at control input 27, the voltage threshold level at junction point 11 may be varied either positively or negatively. If, again, for illustrative purposes, junction point 11 is made slightly more negative, it will require a longer period of time for a negative-going ramp voltage of integrator 7 to reach and cross over this threshold voltage; hence this will make the period or interval of the change of state of comparator 9 a little bit longer and therefore will tend to decrease the frequency of the VCO. Reversing the polarity of $V_b$ would tend to increase the frequency of the VCO. Hence, the objects of the invention have been achieved in the illustrative embodiment of the invention hereinbefore described.

Having shown and described one embodiment of the invention, those skilled in the art will realize that any variation and modifications can be made to produce the described invention and still be within the spirit and scope of the claimed invention.

What is claimed is:

1. A voltage controlled oscillator (VCO) comprising:
a. first means for generating a first threshold voltage having a predetermined voltage level magnitude;
b. second means for generating a second threshold voltage having a predetermined voltage level magnitude;
c. integrating means changeably coupled to said first and second means for integrating a voltage at its input to provide a triangular wave voltage at its output;
d. comparator means coupled to said first and second means and to said integrating means for comparing the triangular wave voltage to one of said first or second threshold voltages;
e. voltage-level changing means coupled to said comparator means, to said integrating means and to said first and second means, said voltage-level changing means for periodically interchanging substantially instantaneously, in response to said comparator means, the first threshold voltage of said first means with the second threshold voltage of said second means; and
f. control means coupled to said voltage changing means, to said comparator means, and to said first and second means, said control means for varying the predetermined level magnitude of the threshold voltages of said first and second means with respect to each other.

2. A voltage controlled oscillator as recited in claim 1 wherein said first and second means and said voltage changing mans generate square wave voltages 180° out of phase with each other.

3. A voltage controlled oscillator as recited in claim 2 wherein said integrating means is an operational amplifier having inverting and non-inverting input terminals and an output terminal and wherein a resistor of a predetermined value is coupled to the inverting terminal of said operational amplifier, and a capacitor of a predetermined value is coupled to the non-inverting input terminal of said operational amplifier.

4. A voltage controlled oscillator as recited in claim 3 wherein said comparator is an operational amplifier having an inverting and non-inverting input terminal and an output terminal, and wherein the triangular wave voltage is applied to the non-inverting input terminal of said comparator.

5. A voltage variable oscillator as recited in claim 4 wherein said voltage-level changing means are electronic switches responsive to the triangular wave voltage and to the first or second threshold voltage level for switching the threshold voltage levels from one predetermined level to another predetermined level.

6. A voltage controlled oscillator as recited in claim 1 wherein said control means includes voltage adjusting means responsive to an input control voltage for adjusting the predetermined level of the first and second threshold voltages.

7. A voltage controlled oscillator as recited in claim 1 including virtual ground means coupled to said comparator means and said first and second means said virtual ground means for providing a virtual ground for said comparator means and for said voltage level changing means.

8. A voltage controlled oscillator as recited in claim 7 further including power supply means coupled to said voltage-level changing means for generating a substantially constant DC voltage, and wherein said virtual-ground means comprise voltage dividers for dividing the DC voltage by two.

9. A voltage controlled oscillator comprising:
a. first square wave voltage generating means for generating a first square wave voltage;
b. integrator means coupled to said square wave generating means said integrator means responsive to said square wave generating means for integrating the square wave voltage and providing a triangular wave ramp voltage having a predetermined slope;
c. virtual ground generating means coupled to said integrator means for providing a virtual ground square wave voltage 180° out of phase to said first square wave voltage of said integrator means;
d. comparator means coupled to said integrator means and to said virtual ground voltage generating means, said comparator means for comparing the triangular wave ramp voltage to the virtual ground voltage;
e. voltage changing means responsive to the triangular wave voltage and virtual ground voltage level for substantially instantaneously changing the virtual ground and the first square wave voltage level from one predetermined level to another predetermined voltage level, said voltage changing means coupled to said comparator means, said integrator means, said first square wave voltage generating means and to said virtual ground voltage generating means,
f. slope changing means coupled to said integrator means for changing the slope of the triangular wave ramp voltage; and
g. voltage adjusting means responsive to an input control voltage for adjusting the predetermined level of the virtual ground voltage, said adjusting means coupled to said virtual ground generating means.

* * * * *